United States Patent [19]
Culshaw

[11] 4,106,043

[45] Aug. 8, 1978

[54] ZENER DIODES

[75] Inventor: Brian Culshaw, Amersham, England

[73] Assignee: National Research Development Corporation, London, England

[21] Appl. No.: 858,405

[22] Filed: Dec. 7, 1977

Related U.S. Application Data

[63] Continuation of Ser. No. 710,156, Jul. 30, 1976, abandoned.

[30] Foreign Application Priority Data

Jul. 31, 1975 [GB] United Kingdom ............... 3207/75

[51] Int. Cl.² .................................................. H01L 29/90
[52] U.S. Cl. .......................................... 357/13; 357/12
[58] Field of Search ..................................... 357/12, 13

[56] References Cited

U.S. PATENT DOCUMENTS

| 3,602,840 | 8/1971 | Nishizawa et al. | 357/12 |
| 3,890,630 | 6/1975 | Huang | 357/13 |

Primary Examiner—Edward J. Wojciechowicz
Attorney, Agent, or Firm—Cushman, Darby & Cushman

[57] ABSTRACT

A zener diode comprises a reverse biassed pn junction having a p-type layer on one side of the junction and two successive n-type depletion layers on the opposite side of the junction with the n-type layer adjacent the junction being more heavily doped than the other n-type layer. The more heavily doped n-type layer determines the temperature co-efficient of the breakdown voltage and the other n-type layer contributes to the total value of the breakdown voltage.

5 Claims, 2 Drawing Figures

ZENER DIODES

This is a continuation, of application Ser. No. 710,156 filed July 30, 1976, now abandoned.

This invention relates to zener diodes.

Zener diodes comprise pn junction diodes which when reverse biassed provide reference voltages across their terminals which are substantially independent of current. The reference voltage is the breakdown voltage of the diode and this is produced by one or both of two mechanisms, namely tunnelling and avalanche multiplication. Tunnelling occurs across a pn junction in the presence of very high electric fields, approaching 1 MV/cm in silicon, whereas avalanche multiplication occurs at lower values of electric field.

Both of the above mechanisms are temperature sensitive and the temperature coefficients are of opposite sign. In conventional diodes one or other phenomenon predominates depending on the breakdown voltage of the diode so that for a given breakdown voltage the sign and magnitude of the temperature coefficient is substantially invariable.

It is an object of the invention to provide a zener diode in which the temperature coefficient is independent of the breakdown voltage.

According to the invention a zener diode comprises a pn junction wherein one side of the junction comprises two layers with the layer adjacent the junction being differently doped than the other layer, the arrangement being such that the temperature coefficient of the breakdown voltage depends on the layer adjacent while the other layer contributes to the total value of the breakdown voltage.

In order that the invention may be more fully understood reference will now be made to the accompanying drawing in which.

Figure 1:
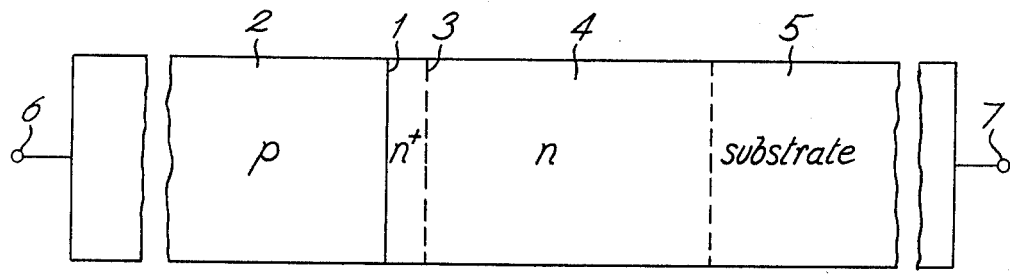
FIG. 1 illustrates diagrammatically a zener diode embodying the invention.

Referring now to FIG. 1 there is shown therein a zener diode comprising a pn junction 1 on one side of which there is a p-type layer 2 and on the other side of which there is an n-type region which is subdivided into a first depletion layer 3 adjacent junction 1 and a further depletion layer 4 adjacent layer 3. Layers 3 and 4 are doped n-type but with different doping concentrations. In the example illustrated layer 3 is more heavily doped than layer 4. Junction 1 and depletion layer 3 and 4 are formed on a substrate 5 doped $n^+$. The diode has two terminals 6 and 7 at opposite ends thereof and when a reverse bias potential is applied across the terminals the voltage between them rises to a predetermined value which is termed the breakdown voltage and thereafter current will flow between the terminals of magnitude such that the breakdown voltage is not appreciably exceeded. The diode thus acts as a voltage reference.

Figure 2:
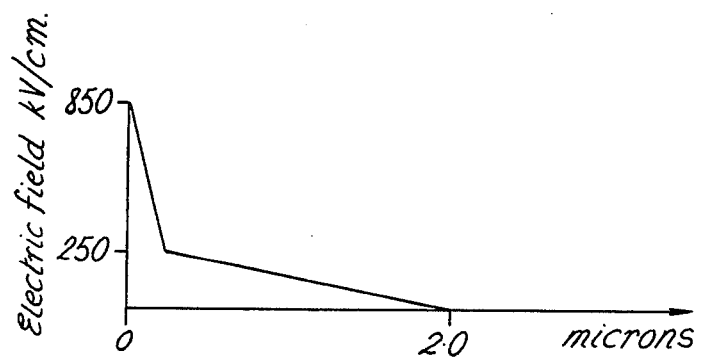
FIG. 2 is a diagram of electric field distribution across the diode.

When the breakdown voltage is reached the electric field distribution across the junction 1 and layers 3 and 4 is as shown in FIG. 2. The total area under the curve is the magnitude of the breakdown voltage and it will be seen that the electric field distribution is in two parts. One part is across layer 3 and reaches a peak value of junction 1 whereas the field across layer 4 rises to a much lower value. The temperature coefficient of the breakdown voltage depends on the peak value to which the field rises at the junction. If this is above about 600 kV/cm in silicon breakdown includes a contribution by tunnelling whereas breakdown by avalanche multiplication depends on the width of the depletion layer 3 in which in silicon the electric field is above 350 kV/cm. The steepness of the slope of the electric field across layer 3 depends on the density of the charge introduced into layer 3. By this means the temperature coefficient of the breakdown voltage of the diode illustrated is controlled by the total charge introduced into layer 3 and its width. In a conventional zener diode these factors would determine the value of the breakdown voltage which would thus be invariably related to the temperature coefficient. However, in the diode described above the additional layer 4 provides a further contribution to the breakdown voltage as evidenced by the additional area under the curve in FIG. 2 so that the two parameters of temperature coefficients and breakdown voltage can be independently determined. In layer 4 the field is so low that avalanche breakdown and tunnelling are both negligible.

As an example, if a zero temperature coefficient of breakdown voltage is desired in a conventional zener diode this will mean that the zener diode must have a breakdwon voltage of about 5½ volts in silicon. With such a diode the maximum field at the pn junction is 850 kV/cm and with a doping density of $4.5 \times 10^{17}$/cc the total depletion layer width of such a structure is about 0.12 microns.

Utilising the above figures a zener diode can be fabricated for any value of breakdown voltage and still having a zero temperature coefficient of breakdown voltage. Depletion layer 3 has a doping density of $4.5 \times 10^{17}$/cc and a width of 0.08 microns. The voltage drop across layer 3 is then about 5 volts. The additional voltage drop that is required is provided by depletion layer 4. As an example for a voltage drop of 20 volts in layer 4, thus giving a total breakdown voltage of 25 volts, layer 4 has a width of 1.75 microns and a doping density of $9 \times 10^{15}$ per cc. The field in layer 3 drops from about 850 kV/cm to 250 kV/cm and the field in layer 4 drops from the latter value to zero. The field distribution in such a device is shown in FIG. 2.

It will be understood that the above example can be readily modified to provide a greater or lesser value of breakdown voltage than 25 volts and if desired a temperature coefficient of breakdown voltage which is non-zero. By providing layer 3 with a doping concentration which is less than the doping concentration of layer 4 a diode is produced which has a breakdown voltage which is lower than that of a conventional zener diode with the same temperature coefficient.

To fabricate a diode embodying the invention ion implantation techniques can be used and the junction can be formed by very shallow diffusion or a Schottky contact. The layer in which the additional voltage is developed can comprise an epitaxial layer fabricated by conventional methods.

I claim:

1. A zener diode comprising a pn junction having two successive n-type layers on one side of the junction which two layers are differently doped to each other, the layer adjacent the junction being of such thickness and of higher concentration than the other n-type layer so that breakdown in said adjacent layer is due at least in part to a tunnelling mechanism and in part to avalanche multiplication to cause current flow through said junction so that said adjacent layer determines the temperature co-efficient of the breakdown voltage and the other layer contributing to the total value of the breakdown voltage.

2. The diode as claimed in claim 1 in which the said layers are formed on a substrate.

3. The diode as claimed in claim 2 in which the said substrate is doped n+.

4. The diode as claimed in claim 1 in which the thickness and doping concentration of the n-type layer adjacent the junction are such that the temperature coefficient of the breakdown voltage is zero.

5. The diode as claimed in claim 4, in which the thickness of the said adjacent layer is approximately 0.08 microns and the doping concentration is approximately $4.5 \times 10^{17}$/cc.

UNITED STATES PATENT AND TRADEMARK OFFICE
CERTIFICATE OF CORRECTION

PATENT NO. : 4,106,043
DATED : August 8, 1978
INVENTOR(S) : Brian CULSHAW

It is certified that error appears in the above–identified patent and that said Letters Patent are hereby corrected as shown below:

In the heading:

Item [30] Foreign Application Priority Data read "3207/75" as --32071/75--

Signed and Sealed this

Twenty-seventh Day of February 1979

[SEAL]

Attest:

RUTH C. MASON
Attesting Officer

DONALD W. BANNER
Commissioner of Patents and Trademarks